THIN FILM TRANSISTOR AND METHOD OF FABRICATION

Filed Dec. 26, 1963 2 Sheets-Sheet 1

INVENTORS
RUDOLPH R. HAERING
MARK G. MIKSIC
BY
S. P. Tedesco
ATTORNEY

THIN FILM TRANSISTOR AND METHOD OF FABRICATION

Filed Dec. 26, 1963

United States Patent Office 3,289,054
Patented Nov. 29, 1966

3,289,054
THIN FILM TRANSISTOR AND METHOD OF FABRICATION

Rudolph R. Haering, Kitchener, Ontario, Canada, and Mark G. Miksic, Yorktown Heights, N.Y., assignors to International Business Machines Corporation, New York, N.Y., a corporation of New York
Filed Dec. 26, 1963, Ser. No. 333,443
6 Claims. (Cl. 317—235)

This invention relates to improved methods of fabricating electrical circuit components and, more particularly, to methods for passivating surface traps in an active semiconductor layer, for example, employed in thin film transistors to achieve enhancement mode operation.

Considerable effort is being expended by industry to develop new solid-state components adapted for batch fabrication techniques. Batch fabrication implies that large numbers of solid-state components are fabricated concurrently onto a single substrate; also, such techniques will include fabrication of electrical interconnections between such components so as to form the final circuit arrangement in a single operation. It is anticipated that batch fabrication techniques will reduce appreciably unit cost of such solid-state components as well as systems costs.

A new solid-state device has been recently described in the scientific literature, for example, by P. K. Weimer, "The TFT—A New Thin-Film Transistor," Proceedings of the IRE, June 1962. The operation of this new solid-state device, described as a field-effect device, closely approximates that of a conventional vacuum triode since "working currents" are supported only by majority carriers. It differs from the conventional "field-effect" transistor as described, for example, by W. Shockley, "A Unipolar Field Effect Transistor," Proceedings of the IRE, pages 1365 through 1376, November, 1962, in that an insulated metallic electrode defines a control gate in lieu of a reverse biased "pn" junction.

The thin film transistor as described by Weimer, supra, compromises a thin layer of semiconductor material deposited between metallic source and drain electrodes; in addition, a metallic control gate electrode insulated from the semiconductor, or active, layer by a thin dielectric film is registered with the source-drain gap. Flow of majority carriers along the active layer is modulated by bias voltages applied to the control gate electrode. In effect, the control gate electrode and the active layer form a capacitor such that carrier concentration in the active layer is a function of control gate bias. Since the active layer can be polycrystalline, thin film transistors and, also, metallic interconnections therebetween to form circuit arrangements can be fabricated by standard vapor deposition techniques.

When fabricated by conventional methods, thin film transistors are normally operative in the depletion mode. Depletion mode operation is distinguishable in that useful source-drain current $I_{sd}$ is obtained with zero control gate bias; a positive control gate bias is necessary to "cut-off" the thin film transistor. For the majority of circuit applications, enhancement mode operation is preferred so as to allow direct coupling between successive thin film transistor stages. To achieve enhancement mode operation, however, the active layer must be specially treated during the fabrication process.

Thin film transistor operation is based on the electrical field-modulation of majority carrier density along a thin surface portion, or conduction channel, of the active layer. Control gate bias, in effect, draws majority carriers into the active layer so as to increase carrier concentration and, hence, conductivity along the conduction channel. The modulation efficiency of a thin film transistor can be defined by the ratio $\Delta n_c/n_c$ where $n_c$ defines residual mobile majority carrier density per unit area of the active layer surface and $\Delta n_c$ is the change in this density per unit change in control gate bias. For enhancement mode operation, the ratio $\Delta n_c/n_c$ should be much greater than unity. More particularly, the quantity $\Delta n_c$ is indicative of the majority carriers induced in the active layer which enters into the conduction channel along the active layer-insulation layer interface per unit change in control gate bias. The quantity $\Delta n_c$, however, is limited by the presence of unfilled traps in the active layer, both volume and surface, which act as a sink for induced majority carriers. Substantial elimination of unfilled traps, both volume and surface, in the active layer would (1) increased the quantity $\Delta n_c$ sufficiently so as to achieve enhancement mode operation and (2) increase the transconductance $g_m$.

As explained in the copending patent application serial No. 333,406, filed on December 26, 1963 on behalf of R. Haering, et al., volume traps can be substantially eliminated by compensating the presence of shallow traps or impurity sites or, alternatively, by doping techniques to introduce deep-level traps, i.e., acceptors, in the active layer. The aformentioned patent application, however, is directed solely to the reduction of volume traps in the active layer. Surface traps due to, for example, impurities, surface defects, incomplete molecular structures exhibiting dangling bonds, etc., cannot be filled in such fashion. Generally, surface traps correspond to energy levels in excess of the Fermi level $E_f$ and, hence, are normally unfilled. To obtain an optimum transconductance $g_m$, surface traps, in addition, to the volume traps, should be filled so as not to limit change in carrier density $\Delta n_c$. Heretofore, the practice has been to apply a small control gate bias to induce sufficient majority carriers in the active layer and fill the surface traps; additional majority carriers induced in the active layer by larger control gate bias, therefore, enter into the conduction band and constitute source-drain voltage $I_{sd}$.

An object of this invention, therefore, is to provide a novel thin film transistor wherein surface traps in the active layer are passivated during the fabrication process.

Another object of this invention is to provide a novel thin film transistor structure which normally exhibits enhancement mode operation.

Another object of this invention is to provide an improved process for fabricating thin film transistors having a controllable transconductance $g_m$.

Another object of this invention is to provide for the passivation of the active layer of a thin film transistor during the fabrication process so as to increase the ratio $\Delta n_c/n_c$ and provide for increased transconductance $g_m$.

These and numerous other objects and advantages of this invention are achieved by forming that portion of the active layer extending to a depth less than the Debye length at the active layer-insulation interface of a lower resistivity and, hence, higher conductivity material than remaining portions of such layer. Debye length is defined as that depth to which electrical fields are effective to modulate majority carrier density in a semiconductor layer. For example, the Debye length extends about 1000A° into the volume of a cadmium sulfide (CdS) layer and is proportional $\sqrt{1/n_c}$.

In accordance with one aspect of this invention, surface traps in an active cadmium sulfide layer are substantially reduced by forming the top strata, i.e., to a depth equal to or less than the Debye length, of a more n-type semiconductor material. The increased number of residual majority carriers $n_c$, in effect, bend the conduction bands at the active layer-insulation layer interface so as to "bury" surface traps below the Fermi level $E_f$. Preferably, residual carrier density $n_c$ in the top strata of the active layer is just sufficient to fill substantially all surface traps. The top strata of the active layer, therefore, exhibits a lower resistivity than portions in excess of the Debye length, also, since the top strata of the active layer defining the conduction channel is shunted by higher resistivity portions, modulation of residual carrier density in such strata is singularly determinative of source-drain current $I_{sd}$.

Residual carrier density $n_c$ in the active layer can be controlled by proper regulation of system parameters. For example, residual carrier density $n_c$ in the top strata of the active layer can be controlled by regulation of evaporant source temperature and, also, substrate temperature; also it is evident that a semiconductor material of different n-type conductivity could be deposited as the top strata of the active layer. In forming the active layer, therefore, system parameters are varied to establish the Fermi level $E_f$ of the top strata of the active layer, i.e. equal to or less than the Debye length, at an energy level in excess of surface traps. Also, and in accordance with the method of the above-identified patent application which is herein incorporated similar effects can be achieved by reducing the degree of compensation or doping of the top strata semiconductor material. In such event, residual carrier density $n_c$ in the top strata of the active layer is increased sufficiently to fill surface traps whereby the entire change in carrier density $\Delta n_c$ induced by control gate bias enters into the conduction band, i.e. source-drain current $I_{sd}$.

Accordingly, a thin film transistor thus forced includes an active layer formed of strati of semiconductor materials exhibiting different conductivities. The conduction channel along the active layer-insulation layer interface is preferably formed of lower-resistivity material and of thicknesses less than the Debye length. Also since the conduction channel thus defined is in parallel with high resistivity materal, electrical fields generated by control gate bias have pronounced effects on source-drain currents $I_{sd}$.

The foregoing and other objects, features, and advantages of this invention will be apparent from the following more particular description of preferred embodiments of the inventions, as illustrated in the accompanying drawings.

Figure 1:
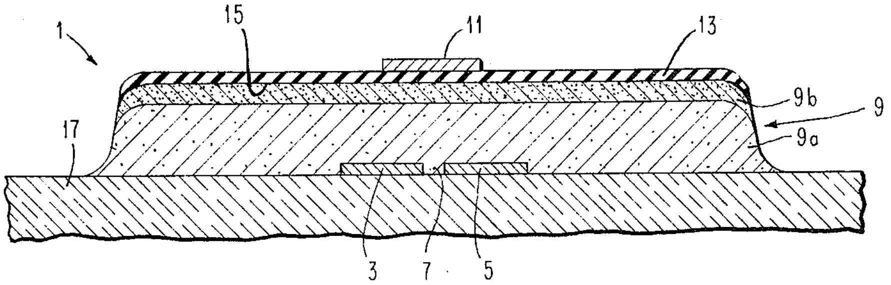
FIG. 1 is a sectional view of a thin film transistor device in accordance with this invention.

As illustrated in FIG. 1, thin film transistor 1 is supported on substrate 17 and comprises a source electrode 3 and a drain electrode 5 defining a source-drain gap 7. Land structures providing electrical connections to thin film transistor 1 have been omitted for purposes of simplicity. Source and drain electrodes 3 and 5, for example, are formed of gold and deposited in narrow parallel strips. A thin layer 9 of semiconductor material, e.g., cadmium sulfide (CdS), is deposited over source and drain electrodes 3 and 5 with source-drain gap 7. Active layer 9 is formed of a first portion 9a and a thinner portion 9b, the latter being of greater n-type conductivity, as hereinafter described. A control gate electrode 11, insulated from active layer 9 by a thin dielectric layer 13, e.g., silicon monoxide (SiO), calcium fluoride ($CaF_2$), etc., is deposited over active layer. It is to be noted that, although not proportionately illustrated, portion 9b of active layer 9 is equal to or less than the Debye length and defines the conduction channel for majority carriers between the source and drain electrodes 3 and 5 and along the active layer-insulation interface 15.

The structure of the thin film transistor 1 of FIG. 1 is similar to and has been described in the above-identified patent application. As therein described, source and drain electrodes 3 and 5 are formed in narrow parallel strips to loosen registration tolerances during the fabrication processes. In prior art devices, control gate 11 is normally deposited in precise registration with source-drain gap 7 to eliminate overlap with source and drain electrodes 3 and 5 so as to minimize spurious capacitance $C_s$.

Dynamically, source electrode 3, control gate electrode 11, and drain electrode 5 are somewhat analogous to the cathode, grid, and plate, respectively, of a conventional vacuum tube triode. In effect, active layer 9 and control gate electrode 11 form plates of a capacitor, control gate bias $V_g$ determining majority carrier concentration, or charge, in active layer 9. In accordance with the present invention, portion 9b is formed either of a same or different material as portion 9a and exhibits greater n-type conductivity. Moreover, since portion 9b is less than the Debye length and defines the conduction channel, at the active layer-insulation interface 15, change in majority carrier density $\Delta n_c$ in portion 9b is a function of (1) control gate bias $V_g$ and (2) the number of unfilled traps, either volume or surface, in active layer 9.

In accordance with this invention, enhancement mode operation is achieved by forming portion 9b of active layer 9 to exhibit sufficient n-type conductivity to passivate surface traps and yet provide substantially no source-drain current $I_{sd}$ at zero control gate bias. Since surface trap density is minimal, substantially the entire change in carrier density $\Delta n_c$ induced in portion 9b by control gate bias $V_g$ constitutes the source-drain current $I_{sd}$. Also, depletion mode operation is achieved by forming portion 9b to exhibit yet greater n-type conductivity so that in addition to passivating surface traps, residual carrier density $n_c$ therein is sufficient to provide source-drain current $I_{sd}$ at zero control gate bias.

Figure 2:
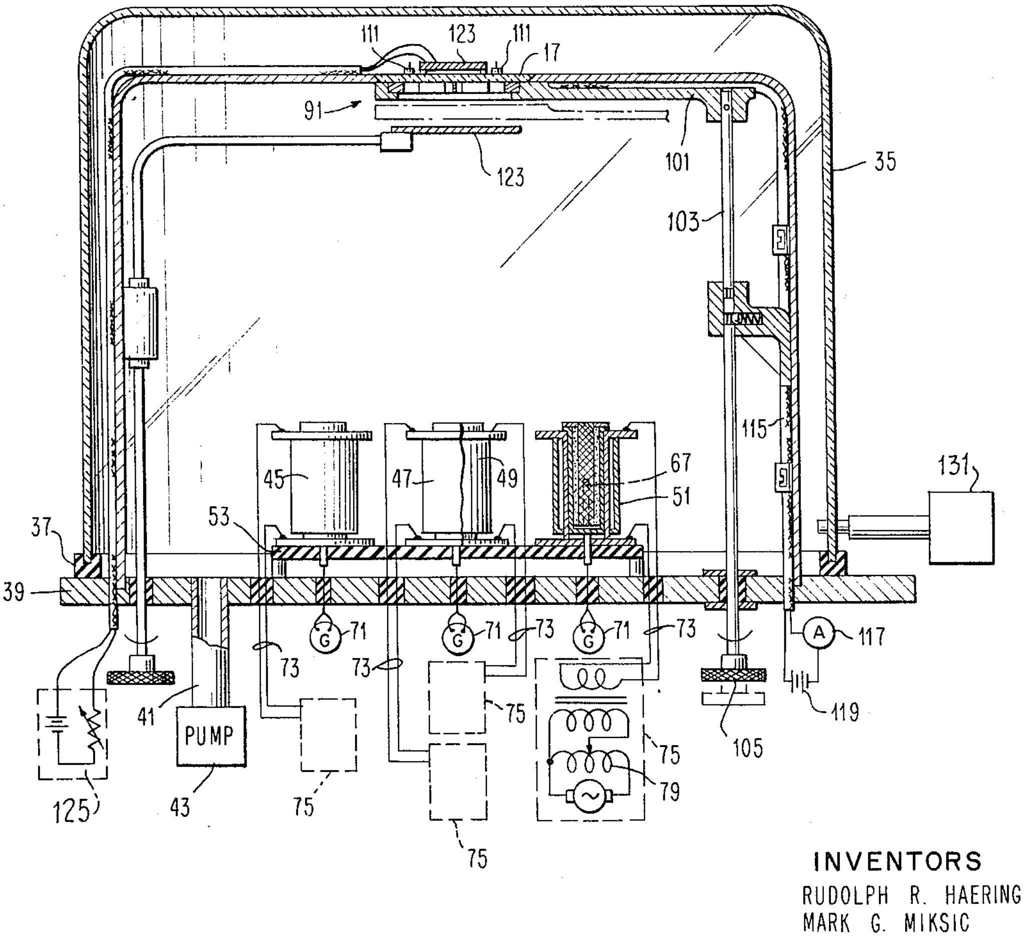
FIG. 2 is an axial view of a vacuum system of conventional type for fabricating thin film transistor devices as shown in FIG. 1.

A vacuum system for fabricating thin film transistor 1 as illustrated in FIG. 2 is substantially identical to that system described in the above-identified patent application; accordingly, similar reference characters have been herein employed. The vacuum system, as illustrated, comprises a low pressure chamber 35, the rim of which is received in an annular groove defined in rubber gasket 37. Rubber gasket 37 rests on base plate 39 and provides an effective vacuum seal to pressures, for example, in the order of $10^7$ Torr. Chamber 35 is evacuated along an exhaust port 41 by a high efficiency vacuum pump 43. Evaporation sources 45, 47, 49, and 51 are mounted on deck plate 53 in cluster fashion so as to direct vaporized evaporant upwardly onto substrate 17. In the fabrication process, semiconductor material, e.g., cadmium sulfide (CDS), lead sulfide (PbS), etc., for forming active layer 9 is vaporized in source 45; source, drain, and, also, control gate electrodes 3, 5, and 11 are formed, for example, of gold vaporized in source 47; dielectric material, e.g., silicon monoxide (SiO), calcium fluoride ($CaF_2$), for forming insulating layer 13 is vaporized in source 49. In the event that portion 9a and 9b of active semiconductor layer 9 are to be formed of different semiconductor materials, additional source 51 is provided; also, when doping techniques are employed, source 51 can be alternatively used to evaporate dopant material. Sources 45 through 51 are each connected along leads 73 to temperature regulators indicated with dotted enclosure 75. Setting of variable inductance 79 in a regulator 75 establishes the corresponding evaporation source at a selected temperature. The evaporation source temperature is indicated by temperature meter 71 and connected to a thermocouple junction 67 (c.f. source 51) positioned in the evaporant stream along the chimney structure of the corresponding evaporation source.

In addition, a masking arrangement 91 (more particularly shown in FIG. 3 of the above-identified patent application) is positioned between evaporation sources 45 through 51 and substrate 17. Masking arrangement 91 includes a series of pattern-defining masks for stenciling patterns of volatilized evaporant from sources 45 through 51, respectively, onto substrate 17. Masking arrangement 91 comprises a fan-shaped mask carrier 101 which supports a series of pattern-defining masks in radial fashion. A control knob 105 disposed exterior to vacuum chamber 35 and connected along rod 103 to mask carrier 101 is rotated to selectively position the pattern-defining masks over substrate 17. Also, a pair of electrical probes 111 are supported along the edge of the mask carrier 101 and aligned so as to sweep over lands, not shown, connected to the source and drain electrodes 3 and 5, respectively, for monitoring resistivity $\rho$ of portions *9a* and *9b* of active layer 9, as hereinafter described. Probes 111 are connected along leads 115 which pass through the base plate 39 to a current meter 117 and current source 119.

During the fabrication process, the vacuum chamber 35 is initially evacuated by vacuum pump 43, say to $10^{-6}$ Torr. The structure of the thin film transistor 1 is fabricated by depositing, in turn, source and drain electrodes 3 and 5, active layer 9, insulation layer 13 and control gate 11 by energizing the appropriate evaporation sources while selectively positioning the appropriate pattern defining masks supported in mask carrier 101 over the substrate 17. With respect to active layer 9, however, the system parameters are determined so as to impart a predetermined resistivity $\rho$, or residual carrier density $n_C$, to portion *9b* which (1) is sufficient to fill substantially all surface traps at the active layer-insulation interface 15 and (2) is greater than that of portion *9a*. In the case of cadmium sulfide (CdS), system parameters are determined such that the number of free cadmium atoms $Cd^{++}$ in portion *9b* of active layer 9 is greater than that in portion *9a*. Such distribution of cadmium atoms $Cd^{++}$ in active layer 9 is achieved by (1) depositing portion *9b* at a higher source temperature, i.e., a faster deposition rate, (2) depositing portion *9b* at a lower substrate temperature, (3) depositing portion *9b* in a lower partial pressure of reactive gaseous atmosphere so as to compensate fewer anion vacancies, and (4) doping portion *9b* to a lesser degree so as to introduce fewer low-level traps. It is to be noted that techniques (3) and (4) relate to processes described in the above-identified patent application. When system parameters are varied during the deposition of active conductor layer 9 in accordance with techniques (1) through (4), a greater and controllable residual carrier density $n_C$ is imparted to portion *9b* of the active layer. Increased residual carrier density $n_C$ in portion *9b* can be determined so as to fill substantially all surface traps and thereby provide that the entire change in carrier density $\Delta n_C$ enters into the conduction band (enhancement mode). If residual carrier density $n_C$ is increased further, depletion mode operation can be purposely achieved. Accordingly, by the method of this invention, thin film transistors exhibiting enhancement mode and depletion mode operation can be formed on a same substrate by selective passivation.

To appreciate the method of this invention, consider that the semiconductor material, e.g., cadmium sulfide (CdS), when volatilized disassociates in accordance with the reaction $2CdS=2Cd+S_2$. Cadmium atoms $Cd^{++}$ are chemically unsaturated and tend to recombine with the free sulfur atoms $S^{--}$ on the surface of substrate 17, i.e., $2Cd+S_2=2CdS$. The probability of recombination of free cadmium atoms $Cd^{++}$ on substrate 17 depends in very large measure on the number of free sulfur atoms $S^{--}$ in the system. Due to differences in vaporization pressures, the ratio of free cadmium atoms $Cd^{++}$ to free sulful atoms $S^{--}$ in the system is a function of evaporation source temperature. In accordance with one aspect of this invention, therefore, residual carrier concentration $n_C$ in portions *9a* and *9b* of active layer 9 is controlled by regulation of evaporation source 45. For example, the cadmium sulfide evaporant is volatilized in source 45 at a first selected temperature to form portion *9a* of active layer 9. The temperature of source 45 is selected so as to impart a relatively low residual carrier density $n_C$ such that portion *9a* exhibits a high resistivity $\rho$ and, hence, a low conductivity. Resistivity $\rho$ of portion *9a* of active layer 9 can be monitored by means of probes 111 and meter 117. To form portion *9b* of active layer 9, however, the cadmium sulfide evaporant is volatilized in source 45 at a higher source temperature, i.e., at a faster deposition rate. The effect is to increase the ratio of free cadmium atoms $Cd^{++}$ to free sulfur atoms $S^{--}$ in the system. Accordingly, portion *9b* exhibits a larger residual carrier concentration $n_C$, i.e., more free cadmium atoms $Cd^{++}$, as compared with the previously-deposited portion *9a* of active layer 9. Portions *9b* of active layer 9, therefore, exhibits a lower resistivity $\rho$ and, because of the excess number of free majority carriers at high energy levels, surface traps at the active layer-insulation interface 15 are filled. Also similar effects can be achieved by maintaining the temperature of source 45 constant and controlling resistance heater 123 by means of variable current source 125 to establish substrate 17 at a lower temperature during deposition of portion *9b*. While system parameters are being varied, substrate 17 can be shielded by baffle 83 by rotating control knob 89.

In accordance with other aspects of this invention, same effects are achieved by compensating anion vacancies in portions *9a* and *9b* of active layer 9 to different degrees. As described in the above-identified patent application, the deposition of semiconductor material on substrate 17 is effected in a reactive atmosphere which is selected to compensate for anion vacancies, i.e., $S^{--}$ vacancies or free $Cd^{++}$ atoms in the lattice. Accordingly, a reactive atmosphere selected from group VI of the periodic table, i.e., oxygen ($O_2$), is introduced at a predetermined partial pressure into vacuum chamber 35 from gaseous source 131 prior to the depoition of portion *9a* of active layer 9. During deposition of active layer 9, free cadmium atoms $Cd^{++}$ are deposited on substrate 17 in both a sulfur ($S_2$) and an oxygen ($O_2$) atmosphere whereby the probability of recombination is high. When portion *9a* is deposited, the relatively large partial pressure of reactive atmosphere in vacuum chamber 35 is effective to reduce residual carrier concentration $n_c$, i.e., $Cd^{++}$; therefore, portion *9a* exhibits a large resistivity $\rho$ and a low conductivity. In forming portion *9b*, however, the partial pressure of the reactive atmosphere is reduced or totally eliminated so as to lessen the probability of recombination of free cadmium atoms $Cd^{++}$ on substrate 17. While the reactive atmosphere is being evacuated by pump 43, baffle 123 can be positioned over substrate 17. Accordingly, residual carrier density $n_c$ is increased and portion *9b* exhibits a lower resistivity $\rho$ than does portion *9a*. Also, when doping techniques as described in the above-identified patent application are employed, portions *9a* and *9b* of the active layer can be doped to different degrees so as to impart a larger residual carrier density $n_c$ to portion *9b*; if desired, only portion *9b* of the active layer 9 is doped. The dopant material is particularly selected to have an affinity for majority carriers. For example, when the active layer 9 is formed of *n*-type cadmium sulfide or lead sulfide, acceptor dopants are selected from group Ib elements of the periodic table; conversely, group Va elements are selected when active layer 9 is formed of $p$-type lead sulfide. In such event, deposition of active layer 9 is interrupted prior to deposition of portion 9$b$ and a predetermined amount of dopant is evaporated from source 51 onto portion 9$a$. Heater 123 is then energized to elevate substrate 17 to a temperature sufficient to cause the dopant to diffuse into portion 9$a$; the diffused dopant introduces low level traps which reduce residual carrier density $n_c$. Portion 9$b$ is then deposited so as to exhibit a larger residual carrier density $n_c$ and, therefore, lower resistivity $\rho$.

The effect of increased residual carrier density $n_c$ in portion 9$b$ of the active layer 9 can be considered in terms of increased transconductance $g_m$. Transconductance $g_m$, given as $dI_{sd}/dV_g$, is prportional to the fraction of majority carrier change $\Delta n_c$ which enters into the conduction band per unit change in control gate bias $V_g$. If the total majority carrier change induced in active layer 9 is represented by $dn$, the expression is made that $dn=dn_c+dn_t$, where $dn_c$ indicates that portion of induced majority carriers entering into the conduction band and $dn_t$ indicates that portion of induced majority carriers adsorbed by traps, either volume or surface. When the quantity $dn_c$ predominates, transconductance $g_m$ is increased and useful source-drain current $I_{sd}$ is obtained for low values of control gate bias $V_g$. For purposes of description, it is assumed that only surface traps are present in the active layer 9, substantially all volume traps having been filled.

Figure 3A:
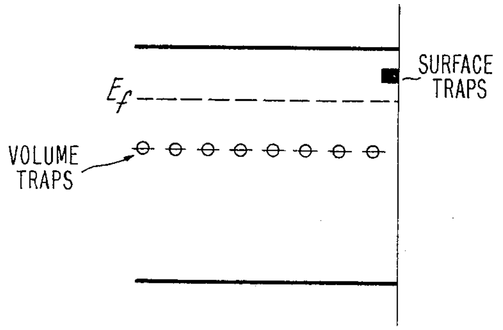
FIG. 3A is an energy diagram illustrating the conduction bands at the active layer-insulation layer interface when surface traps have not been passivated in accordance with this invention.
Figure 3B:
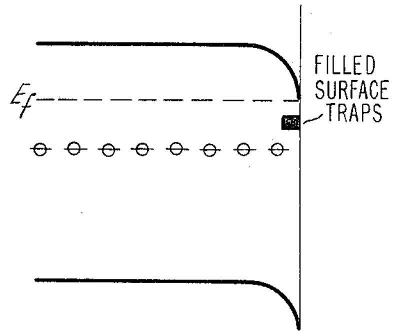
FIG. 3B is an energy diagram illustrating the conduction bands at the active layer-insulation layer interface when surface traps have been passivated.

Reference is made to FIG. 3$a$ which depicts the energy band picture at active layer-insulation interface 15 when active layer 9 is unpassivated and the carrier density $n_c$ is insufficient to fill surface traps; on the other hand, FIG. 3B depicts the energy band picture at the same interface when active layer 9 has been selectively passivated to fill substantially all surface traps. As illustrated in FIG. 3$b$, increased residual carrier density $n_c$ in portion 9$a$ of passivated active layer 9, in effect, bends the conduction bands at the active layer-insulation interface 15 sufficiently to "bury" surface traps below the Fermi level $E_f$.

Figure 4A:
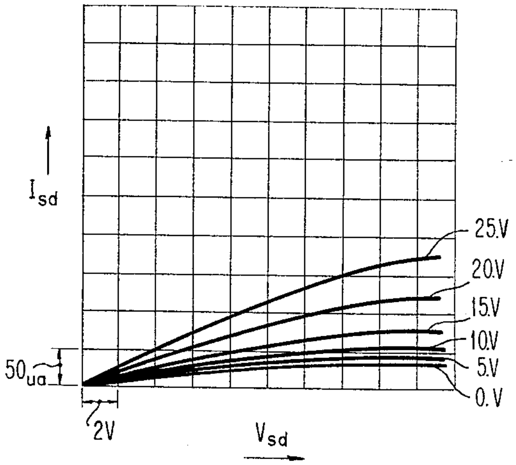
FIGS. 4A and 4B illustrate source-drain current $I_{sd}$-source-drain voltage $V_{sd}$ characteristic curves of unpassivated and passivated thin film transistors, respectively.

When active layer 9 is unpassivated and considering that all volume traps have been filled, the Fermi level $E_f$ is normally at an energy level below that of the surface traps as shown in FIG. 3A. Accordingly, when control gate bias $V_g$ is applied, the conduction bands at the active layer-insulation interface 15 bends downwardly (c.f. FIG. 3B) and surface traps, previously unfilled, are "buried" below the Fermi level $E_f$. The "buried" surface traps act as a sink for majority carriers induced in active layer 9 such that the portion entering into the conduction band, i.e., $dn_c$, is small. The resulting current $I_{sd}$—voltage $V_{sd}$ characteristic curves shown in FIG. 4A illustrate that a relatively large control gate bias $V_g$ is necessary to draw useful source-drain current $I_{sd}$, the curves for the lower values of control gate bias being compressed. Although good "cut-off" operation is obtained for zero control gate bias, excessive control gate bias $V_g$ is required to draw useful source-drain current $I_{sd}$.

Figure 4B:
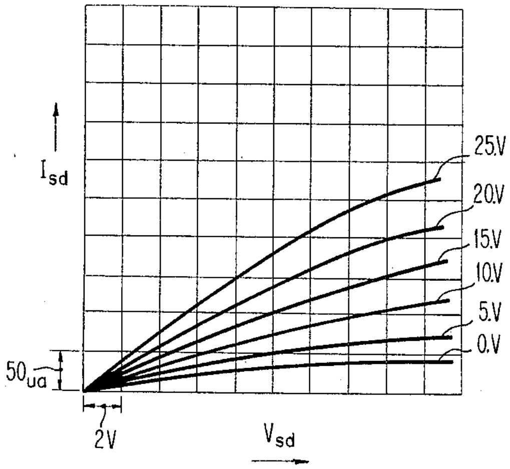

When residual carrier concentration $n_c$ in portion 9$a$ of active layer 9 is increased, surface traps are passivated, or filled, and preferred operating characteristics are obtained. FIG. 3B, shows the conduction bands at active layer-insulation interface 15 when portion 9$a$ is sufficient to passivate substantially all surface traps. As residual carrier density $n_c$ in portion 9$b$ is increased, the conduction band bends downwardly and "bury" surface traps below the Fermi level $E_f$. As illustrated, the residual carrier density $n_c$ of portion 9$b$ is just sufficient to bend conduction bands at the active layer-insulation interface 15 to "bury" the surface traps. The result, therefore, is similar to that achieved if a constant control gate bias $V_g$ of low magnitude is supplied; however, due to the increased residual carrier density $n_c$ in portion 9$b$, this bias phenomenon is inherent in active layer 9. Accordingly, substantially all majority carriers induced in active semiconductor layer when control gate bias $V_g$ is applied enter into the conduction band. That is, the quantity $dn_c$ predominates and the quantity $dn_t$ is minimal. As shown in FIG. 4B, the current $I_{sd}$—voltage $V_{sd}$ curves for lower values of control gate bias $V_g$ when active layer 9 is passivated are expanded with respect to those illustrated in FIG. 4A and usable source-drain current $I_{sd}$ is obtained for lower values than control gate bias $V_g$. In the event that residual carrier density $n_c$ in portion 9$b$ is further increased, the conduction bands are further bent and depletion mode operation results.

While the invention has been particularly shown and described with reference to preferred embodiments thereof, it will be understood by those skilled in the art that various changes in form and details may be made therein without departing from the spirit and scope of the invention.

What is claimed is:

1. A thin film transistor device comprising source and drain electrodes defining a source-drain gap, a semiconductor active layer within said gap and electrically connecting said source and drain electrodes, a dielectric layer formed over said active layer, and a control gate electrode formed over said dielectric layer and arranged in electrical field-applying relationship with active layer for modulating carrier density with said active layer, the improvement that said active layer includes distinct first and second layers of semiconductor material exhibiting different resistivities said first layer of semiconductor material adjacent said control gate electrode having a lower resistivity than said second layer of semiconductor material.

2. A thin film transistor as defined in claim 1 wherein said first layer and said second layer are formed of a same semiconductor material.

3. A thin film transistor consisting of a source and a drain electrode, a first layer of semiconductor material electrically connecting said source and drain electrodes and exhibiting a first resistivity, a dielectric layer formed over said first layer of semiconductor material, and a control gate electrode formed over said dielectric layer and arranged in the electrical field-applying relationship and juxtaposed in insulated fashion at one surface of said first layer of semiconductor material, said semiconductor material being bounded on the opposite surface by an additional layer of semiconductor material of same conductivity type and having a larger resistivity whereby majority carrier flow between said source and drain electrodes is essentially defined along said first layer of semiconductor material.

4. A thin film transistor as defined in claim 3 wherein said first layer of semiconductor material is of a thickness less than the Debye length.

5. A thin film transistor comprising a first and a second metallic electrode, a layer of semiconductor material connecting said metallic electrodes, a dielectric layer formed over said layer of semiconductor material, and control gate means formed over said dielectirc layer for applying electrical fields to at least one surface of said semiconductor material so as to modulate carrier density there, that surface portion of said semiconductor material wherein said electrical fields are effective to modulate carrier density being formed of a first conductivity type material of given resistivity, remaining portions of said semiconductor material being formed of a same conductivity type material having a higher resistivity than said given resistivity.

6. A thin film transistor comprising a source and a drain electrode defining a source-drain gap, semiconductor material formed within said gap to define an active layer electrically connecting said source and drain electrodes, a dielectric layer formed over said active layer, and a control gate formed over said dielectric layer and arranged in electrical field-applying relationship at one surface of said active layer, surface portions of said active layer adjacent said one surface and to a depth less than a Debye length having a lower resistivity than remaining portions of said active layer whereby majority carrier flow along said active layer and between said source and drain electrodes in response to said control gate is essentially determined by carrier modulation in said surface portions, said remaining portions of said active layer being of sufficiently high resistivity so as not to substantially contribute to majority carrier flow between said source and drain electrodes.

References Cited by the Examiner

UNITED STATES PATENTS

| | | | |
|---|---|---|---|
| 2,985,805 | 5/1961 | Nelson | 317—235 |
| 3,010,033 | 11/1961 | Noyce | 307—88.5 |
| 3,094,671 | 6/1963 | Garrett et al. | 330—4.9 |
| 3,148,284 | 9/1964 | Wertwijn | 307—88.5 |
| 3,178,798 | 4/1965 | Marinace | 29—25.3 |
| 3,183,576 | 5/1965 | Dill | 29—25.3 |
| 3,191,061 | 6/1965 | Weimer | 307—88.5 |
| 3,217,215 | 11/1965 | Gault | 317—235 |

JOHN W. HUCKERT, *Primary Examiner.*

M. EDLOW, *Assistant Examiner.*